United States Patent
Ferguson

[19]

[11] Patent Number: 6,147,299

[45] Date of Patent: Nov. 14, 2000

[54] DEVICE FOR IMPROVING SHIELDING EFFECTIVENESS OF AN ELECTROMAGNETIC INTERFERENCE ENCLOSURE

[75] Inventor: Steven Greer Ferguson, Joppatowne, Md.

[73] Assignee: Raytheon Company, Lexington, Mass.

[21] Appl. No.: 08/891,006

[22] Filed: Jul. 10, 1997

[51] Int. Cl.[7] ................................................ H05K 9/00
[52] U.S. Cl. ................................ 174/35 R; 174/35 TS; 174/35 CE; 361/816; 361/818; 361/800; 336/84 M; 336/84 R; 439/339; 439/340; 439/550; 439/551
[58] Field of Search .............................. 174/35 R, 35 TS, 174/35 CE; 361/816, 818, 800; 336/84 M, 84 R; 411/402, 410, 919; 333/185, 12; 439/339, 340, 550, 551

[56] References Cited

U.S. PATENT DOCUMENTS

| | | | |
|---|---|---|---|
| 2,321,510 | 6/1943 | Paquette | 240/7.1 |
| 2,440,288 | 4/1948 | Paulus et al. | 200/159 |
| 3,924,223 | 12/1975 | Whyte et al. | 340/310 R |
| 5,091,707 | 2/1992 | Wollmerschauser et al. | 333/12 |
| 5,159,537 | 10/1992 | Okano | 361/424 |
| 5,162,772 | 11/1992 | May | 336/92 |
| 5,296,647 | 3/1994 | Banker | 174/58 |
| 5,537,087 | 7/1996 | Naito | 336/92 |
| 5,539,148 | 7/1996 | Konoshi et al. | 174/35 R |

FOREIGN PATENT DOCUMENTS

| | | | |
|---|---|---|---|
| 2022318 | 5/1970 | Germany . | |
| 1628585 | 4/1971 | U.S.S.R. | 174/35 R |
| 1332439 | 8/1987 | U.S.S.R. | 174/35 R |

OTHER PUBLICATIONS

Suggested correction of applicant's amended figure 5, Feb. 8, 1999.

*Primary Examiner*—William A. Cuchlinski, Jr.
*Assistant Examiner*—Ronnie Mancho
*Attorney, Agent, or Firm*—Daly, Crowley & Mofford, LLP

[57] ABSTRACT

A device for improving the shielding effectiveness of apertures used for mounting electrical component in an enclosure from Electromagnetic Interference (EMI). The device includes a hollow housing which contains and a disc with an aperture, where the disc is attached to an inner surface of the housing to define a first and second inner space. The device also includes a ferrite core which is fit into the second inner space.

20 Claims, 5 Drawing Sheets

DEVICE FOR IMPROVING SHIELDING EFFECTIVENESS OF AN ELECTROMAGNETIC INTERFERENCE ENCLOSURE

BACKGROUND

A) Field of Invention

The present invention relates to a device for improving the shielding effectiveness of an Electromagnetic Interference (EMI) enclosure and, more particularly, to a device for improving the shielding effectiveness of an aperture in the enclosure which is used for mounting an electrical component.

B) Description of Related Art

FIG. 1 shows a cross-sectional side view of a conventional enclosure 1 which houses sensitive electrical components. The enclosure 1 typically includes two types of electrical components—electrical components 3 which are used to process information, and electrical components 7 which are used to display information or to control processing functions.

The electrical components 3 contained within the enclosure 1 are typically attached to a stationary surface 2, such as a printed circuit board, and can be used for any operation. However, for purposes of this discussion, it is assumed that the electrical components 3 are used on an aircraft to process information received from either an air traffic control station or another aircraft.

The enclosure 1 also includes electrical components 7 which are used for displaying information or control processing. The electrical component 7 is positioned within an aperture 5 defined in an outer surface of the enclosure 1. The electrical component 7 contains threads 8 on its outer surface and therefore can be secured to the enclosure 1 by use of a nut 9.

Conventional enclosures, such as the one shown in FIG. 1, are typically made of a metal to shield the electrical components 3 from unwanted EMI. However, conventional enclosures fail to maintain an adequate EMI shield. Two factors contribute to this failure.

The first factor relates to an infiltration caused by an external EMI 11 which is present in the environment surrounding the enclosure 1. This external EMI 11 is generated by either natural events, such as lightning, or by other man-made electrical devices located on or near the plane.

The external EMI 11 enters the enclosure 1 in a number of ways. For example, when the electrical component 7 is not shielded, the external EMI 11 can enter the enclosure 1 by simply passing through the aperture 5. The EMI 11 can also enter the enclosure 1 through the conductive elements 6 contained within the electrical component 7.

When the external EMI 11 infiltrates the enclosure 1, the operation of the electrical components 3 are susceptible to operational degradation.

The second factor contributing to the failure of conventional enclosures results from an internal EMI 13 produced by the electrical components 3 themselves. This internal EMI typically represents electromagnetic emissions from signal leads, power leads, or antenna leads contained on the electrical components 3. The internal EMI can escape the enclosure 1 and interfere with other electronic devices outside of the enclosure.

In view of these problems with conventional enclosure openings, there currently exists a need for a device which (i) can improve the shielding effectiveness of apertures for electrical components placed within an enclosure, (ii) can easily be installed on the enclosure, and (iii) can be manufactured with low cost materials and low cost manufacturing techniques.

SUMMARY OF THE INVENTION

It is accordingly an object of the present invention to provide a device which will maintain a shielding effectiveness of apertures for electrical components placed within an enclosure.

It is another object of the invention to provide a device which can easily be installed on the enclosure.

It is still another object of the invention to provide a device which can be manufactured with low cost materials and low cost manufacturing techniques.

In accordance with the invention, a device for improving the shielding effectiveness of an aperture for mounting an electrical component in an enclosure from EMI is provided, where the device comprises: a housing which has inner surface and an outer surface; a disc with an aperture which is attached to the inner surface of the housing to define a first inner space and a second inner space; and, a ferrite core with an aperture, the ferrite core being fit into the second inner space; wherein the electrical component is fit into the first inner space of the device.

In accordance with another aspect of this device, the housing is made of a material that is Galvanically compatible with the material of the enclosure.

In accordance with another aspect of this device, the inner surface of the housing is cylindrically shaped and the outer surface of the housing is octagonally shaped.

In accordance with still another aspect of this device, the disc aperture is circularly shaped, and a depth of the housing and a diameter of the circular disc aperture are governed by equation 1 below:

$$SE_{(db)} = 31.95 \frac{t}{d} \sqrt{1 - \left(\frac{df}{6920}\right)^2} \quad (1)$$

where SE represents the shielding effectiveness of the housing, t represents the depth of the housing, d represents the diameter of the circular disc aperture, and f represents the frequency of the EMI being shielded.

In accordance with even another aspect of this device, the disc aperture is rectangularly shaped, and a depth of the housing and a length of the rectangular disc aperture are governed by equation 2 below:

$$SE_{(db)} = 27.3 \frac{t}{d} \sqrt{1 - \left(\frac{df}{5910}\right)^2} \quad (2)$$

where SE represents the shielding effectiveness of the housing, t represents the depth of the housing, d represents a longest side of the of the rectangular disc aperture, and f represents the frequency of the EMI being shielded.

In accordance with even still another aspect of this device, the electrical component is secured to the first inner space of the housing by threads contained in the first inner space of the housing and on the electrical component.

In accordance with the invention, another device for shielding electrical components in an enclosure with an aperture from EMI is provided, where this device comprises: a cylindrical shield with a hollow inner space; a disc with an aperture which is fit into the hollow inner space to define a first inner space and a second inner space; and, a cylindrical filter with a hollow inner space; where the cylindrical filter is fit into the second inner space.

In accordance with one aspect of this device, the cylindrical shield is made of a material that is Galvanically compatible with the material of the enclosure, and the cylindrical filter is made of ferrite.

In accordance with another aspect of this device, the disc aperture is circularly shaped, and a depth of the cylindrical shield and a diameter of the circular disc aperture are governed by equation 1 below:

$$SE_{(db)} = 31.95 \frac{t}{d} \sqrt{1 - \left(\frac{df}{6920}\right)^2} \quad (1)$$

where SE represents the shielding effectiveness of the cylindrical shield, t represents the depth of the cylindrical shield, d represents the diameter of the circular disc aperture, and f represents the frequency of the EMI being shielded.

In accordance with still another aspect of this device, the disc aperture is rectangularly shaped, and a depth of the cylindrical shield and a length of the rectangular disc aperture are governed equation 2 below:

$$SE_{(db)} = 27.3 \frac{t}{d} \sqrt{1 - \left(\frac{df}{5910}\right)^2} \quad (2)$$

where SE represents the shielding effectiveness of the cylindrical shield, t represents the depth of the cylindrical shield, d represents a longest side of the of the rectangular disc aperture, and f represents the frequency of the EMI being shielded.

In accordance with the invention, another device for improving the shielding effectiveness of an aperture contained in an enclosure from EMI is provided, where the device comprises: a housing which has an inner surface and an outer surface; a disc with an aperture, the disc being attached to the inner surface of the housing to define a first inner space and a second inner space; and, a ferrite core with an aperture for housing a conductor, the ferrite core being fit into the second inner space; where, the housing is attached to the enclosure such that the first inner space is in alignment with the aperture in the enclosure.

In accordance with one aspect of this device, the housing is made of a material that is Galvanically compatible with the material of the enclosure.

In accordance with another aspect of this device, the disc aperture is circularly shaped, and a depth of the housing and a diameter of the circular disc aperture are governed by equation 1:

$$SE_{(db)} = 31.95 \frac{t}{d} \sqrt{1 - \left(\frac{df}{6920}\right)^2} \quad (1)$$

where SE represents the shielding effectiveness of the housing, t represents the depth of the housing, d represents the diameter of the circular disc aperture, and f represents the frequency of the EMI being shielded.

In accordance with still another aspect of this device, the disc aperture is rectangularly shaped, and a depth of the housing and a length of the rectangular disc aperture are governed by equation 2:

$$SE_{(db)} = 27.3 \frac{t}{d} \sqrt{1 - \left(\frac{df}{5910}\right)^2} \quad (2)$$

where SE represents the shielding effectiveness of the housing, t represents the depth of the housing, d represents a longest side of the rectangular disc aperture, and f represents the frequency of the EMI being shielded.

BRIEF DESCRIPTION OF THE DRAWINGS

The accompanying drawings are included to provide an understanding of the invention and constitute a part of the specification.

DETAILED DESCRIPTION OF THE INVENTION

Figure 1:
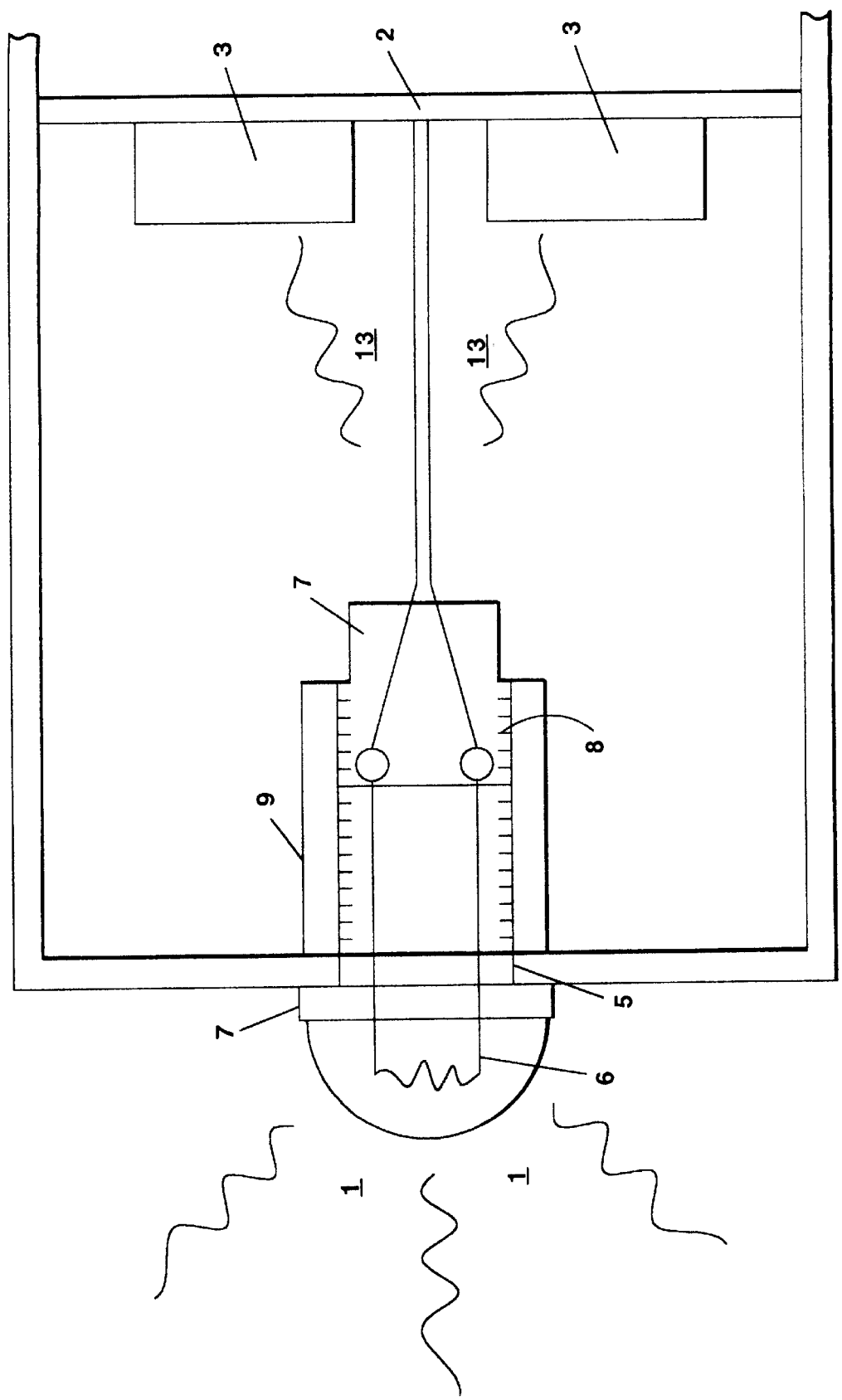
FIG. 1 illustrates a cross-sectional side view of a conventional enclosure used to house and shield electrical components from unwanted EMI.
Figure 2:
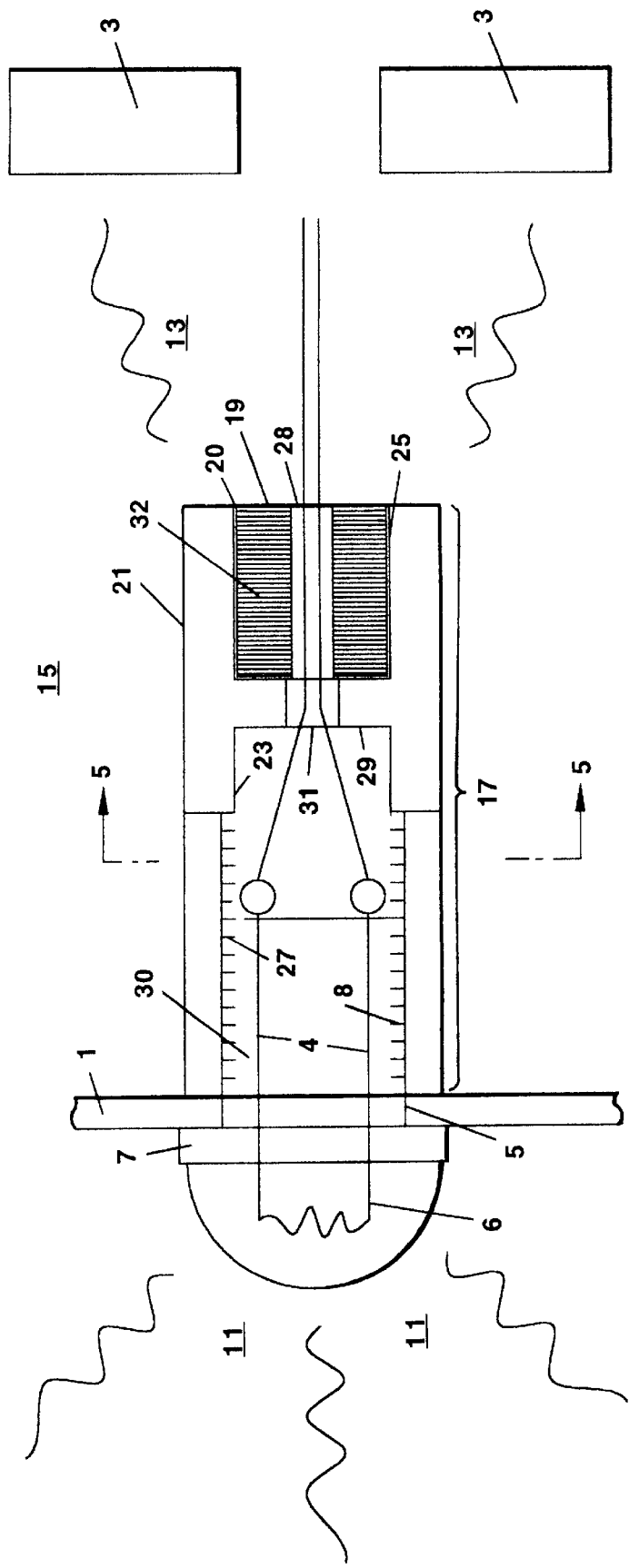
FIG. 2 illustrates a device for improving the shielding effectiveness of an aperture for electrical components within an enclosure in accordance with the present invention.

FIG. 2 shows a cross-sectional side view of a device 15 for improving the shielding effectiveness of apertures used to mount electrical components within an enclosure 1 in accordance with the present invention. The device 15 includes a housing 17 and a ferrite core 19.

The housing 17 has a first inner surface 23 and a second inner surface 25 which are separated by a disc 29. The first inner surface 23 and disc 29 define a first cylindrical space 30 for housing the electrical component 7, whereas, the second inner surface 25 and the disc 29 define a second cylindrical space 32 for housing the ferrite core 19. Also, the disc 29, which divides the housing 17, contains a circular aperture 31 to accommodate conductors 4 which are attached to the conductive elements 6 of the electrical component 7.

The electrical component 7 is secured to the enclosure 1 by mating threads 27 contained on the first inner surface 23 of the housing 17 with threads 8 contained on the outer surface of the electrical component 7. Also, an outer surface 21 of the housing 17 is designed to be octagonally shaped to allow for a wrench to be used when securing the housing 17 to the electrical component 7.

The ferrite core 19 contains an aperture 28 and is positioned within the second cylindrical space 32 defined by the inner surface 25 and disc 29. The ferrite core 19 is attached to the inner surface 25 of the housing 17 and disc 29 by use of an adhesive 20 such as silicone.

The ferrite core 19 is provided to filter high frequency EMI which infiltrates the enclosure 1 through the conductive elements 6 and is thus present in the conductors 4. The ferrite core 19 functions as an EMI filter by providing a resistance which attenuates and dissipates the high frequency EMI contained in the conductors 4. The ferrite core 19 also filters unwanted signals produced by the electrical components 3.

The ferrite core 19 functions as an EMI filter given that its properties allow it to operate like a frequency dependent resistor. That is, the higher the frequency of the signal passing though the conductors 4 the greater the resistance of the ferrite core 19. Conversely, the lower the frequency of the signal passing through the conductors 4 the lower the resistance of the ferrite core 19. Thus, the ferrite core 19 filters the high frequency EMI passing through the conductors 4 while simultaneously allowing the lower frequency signals to pass through for normal circuit operations.

The ferrite core 19 is typically made from mixtures of iron, nickel and zinc oxides. An example of a material that can be used to produce the ferrite core 19 is a material that is available from Ferronics, Incorporated as Torroid Part Number 11-220.

The housing 17 and disc 29 similarly shield the electrical components 3 and 7 from unwanted EMI. To effectively shield the components 3 and 7, the housing 17 and disc 29 must, however, maintain dimensions which fall within certain guidelines. In particular, referring to FIG. 3, the depth t of the housing 17 and the diameter d of the circular aperture 31 in the disc 29 must maintain a specific dimensional relationship to effectively shield the EMI 11. This dimensional relationship is governed by Equation 1 which is presented below.

$$SE_{(db)} = 31.95 \frac{t}{d} \sqrt{1 - \left(\frac{df}{6920}\right)^2} \quad (1)$$

In Equation 1, SE represents the shielding effectiveness of the device 17 and disc 29, t equals the depth of the housing 17 as measured in inches, d equals the diameter of the circular aperture 31 as measured in inches, and f equals the frequency of the EMI 11 as measured in MHZ.

Thus, if the device 15 was being designed for use in an environment that was to be exposed to an EMI 11 with a signal strength of 80 dB (i.e., SE=80) and frequency of 1000 MHZ (i.e., f=1000), then the parameters of t and d would be designed to satisfy the relationship defined by Equation 1. So long as this dimensional relationship is maintained, any EMI 11 with a frequency less than 1000 MHZ would be adequately shielded from the electrical components 3.

Figure 4:
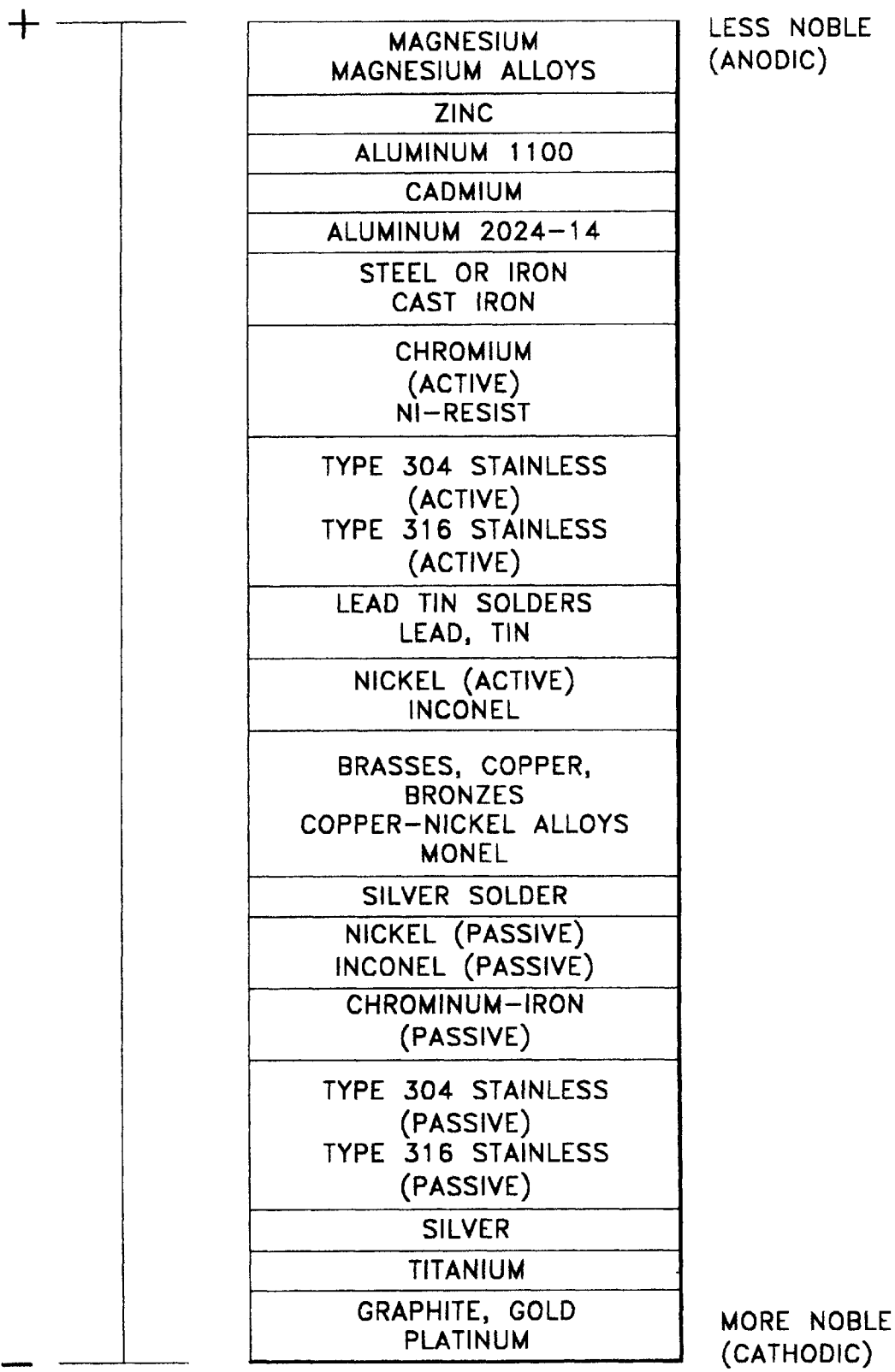
Figure 5:
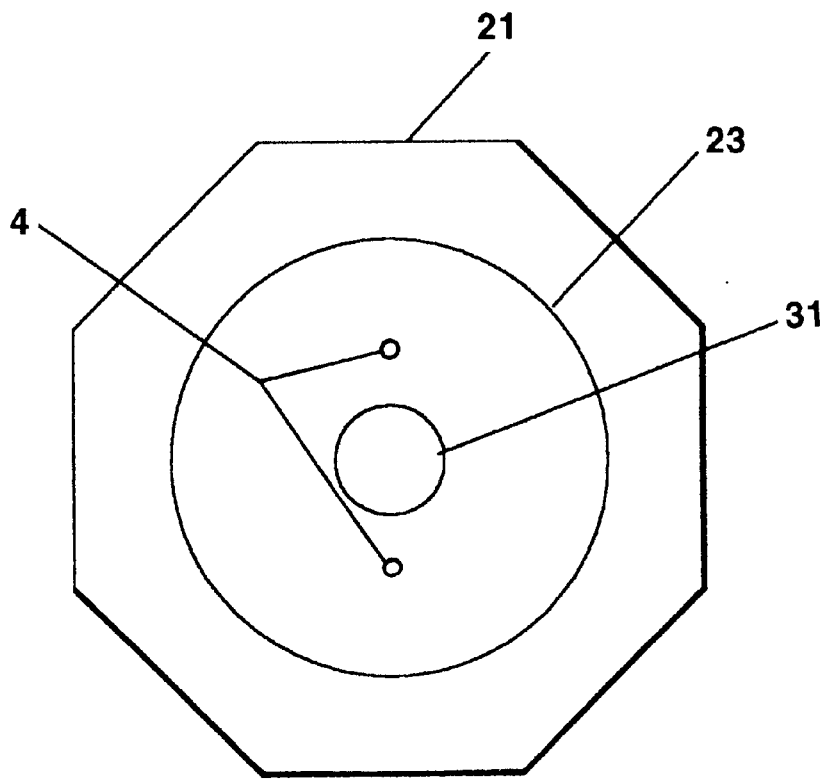
FIG. 5 is a cross sectional view of the device shown in FIG. 2 taken across lines 5—5.

The housing 17 is further designed to be made of a material that is Galvanically compatible with the material of the enclosure 1. This is done to prevent corrosion and to prolong the life cycle of the housing 17. FIG. 4 shows a Galvanic Scale which can be used when selecting a material for the housing 17.

The guideline for selecting a Galvanically compatible material for the housing 17 is to choose a material which is the same as the material used for the enclosure 1, or to choose a material which is less noble than that of the material used for the enclosure 1. For example, if the enclosure 1 were made of a material such as aluminum 2024-14, then the housing 17 would need to be made of aluminum 2024-14 or of a less noble alloy such as zinc. Similarly, if the enclosure 1 were made of aluminum 2024-14, the housing 17 would not be made of a more noble alloy such as silver.

Figure 3:
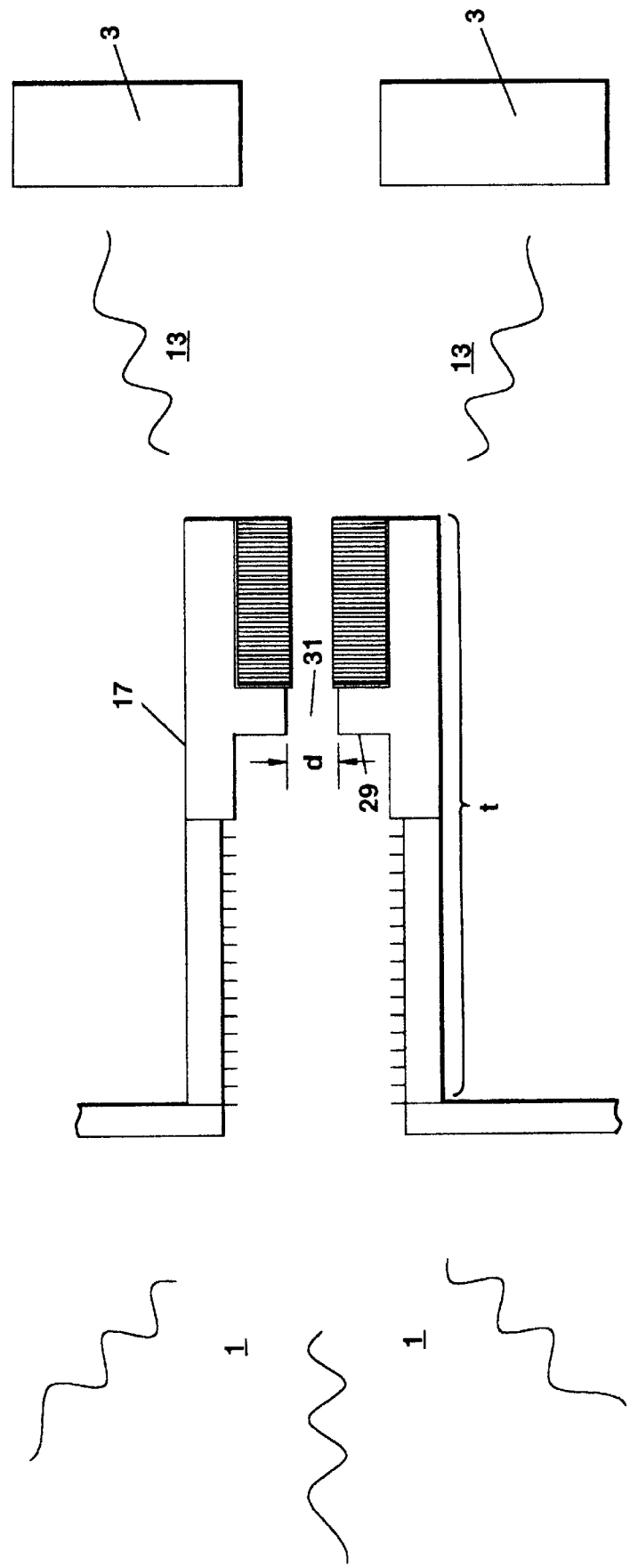
FIG. 3 illustrates the dimensional relationships of measurements of the device shown in FIG. 2; and, FIG. 4 illustrates Galvanic Scale which can be used when selecting a materials for the device shown in FIGS. 2 and 3.

It is important to note that the present invention is not to be considered limited in scope by the embodiments shown in FIGS. 2–4 and described above. For example, although the disc aperture 31 is described as being circular, a device developed in accordance with the present invention will function equally well if the aperture 31 is rectangularly shaped. However, if a rectangular aperture were to be used, the shielding effectiveness of the device will not be governed by Equation 1 above, but rather by Equation 2 below.

$$SE_{(db)} = 27.3 \frac{t}{d} \sqrt{1 - \left(\frac{df}{5910}\right)^2} \quad (2)$$

The definitions for the variables shown in Equation 2 are the same as those discussed above for Equation 1 except, however, in Equation 2 the variable d defines the longest side of the rectangular aperture.

Also, the device presented in FIGS. 2–4 shows the first inner surface 23 and disc 29 as defining a first cylindrical space 30 for housing a cylindrical electrical component 7. The device developed in accordance with the present invention will work equally well if the first inner surface 23 and the disc 29 define a rectangular space for housing a rectangular electrical component. However, if this rectangular configuration is used, the housing 17 will not be secured to the electrical component 7 by the use of threads, but will rather be press fit or clamped to the electrical component 7.

Additional advantages and modifications of the invention, which will readily occur to those skilled in the art from consideration of the specification and practice of the invention, are intended to be within the scope and spirit of the following claims.

What is claimed is:

1. A device for improving shielding effectiveness of an enclosure from electromagnetic interference (EMI), said device comprising:

a housing which has an inner surface and an outer surface;

a disc with an aperture, said disc being attached to said inner surface of said housing to define a first inner space adapted to receive an electrical component and a second inner space; and a ferrite core with an aperture, said ferrite core being fit into said second inner space wherein said disc aperture is circularly shaped, and a depth of said housing and a diameter of said circular disc aperture are governed by the equation:

$$SE_{(db)} = 31.95 \frac{t}{d} \sqrt{1 - \left(\frac{df}{6920}\right)^2}$$

where SE represents the shielding effectiveness of said housing, t represents the depth of said housing, d represents the diameter of said circular disc aperture, and f represents the frequency of the EMI being shielded.

2. A device according to claim 1, wherein said housing is made of a material that is Galvanically compatible with the material of the enclosure.

3. A device according to claim 1, wherein said inner surface of said housing is cylindrically shaped and said outer surface of said housing is octagonally shaped.

4. A device according to claim 1, wherein said electrical component is secured to said first inner space of said housing by threads contained in said first inner space and on said electrical component.

5. A device for improving shielding effectiveness of an enclosure from electromagnetic interference (EMI), said device comprising:

a housing which has an inner surface and an outer surface;

a disc with an aperture, said disc being attached to said inner surface of said housing to define a first inner space adapted to receive an electrical component and a second inner space; and a ferrite core with an aperture said ferrite core being fit into said second inner space wherein said disc aperture is rectangularly shaped, and a depth of said housing and a length of said rectangular disc aperture are governed by the equation:

$$SE_{(db)} = 27.3 \frac{t}{d} \sqrt{1 - \left(\frac{df}{5910}\right)^2}$$

where SE represents the shielding effectiveness of said housing, t represents the depth of said housing, d represents a longest side of said rectangular disc aperture, and f represents the frequency of the EMI being shielded.

6. A device according to claim 5, wherein said electrical component is secured to said first inner space of said housing by threads contained in said first inner space and on said electrical component.

7. A device according to claim 5, wherein said housing is made of a material that is Galvanically compatible with the material of the enclosure.

8. A device according to claim 5, wherein said inner surface of said housing is cylindrically shaped and said outer surface of said housing is octagonally shaped.

9. A device for use with an enclosure having an aperture therein, said shielding device comprising:

a cylindrical shield having a hollow inner space;

a cylindrical filter having a hollow inner space;

a disc having an aperture, said disc being fit into said hollow inner space to define a first inner space and a second inner space wherein, said second inner space is adapted to receive said cylindrical filter wherein said disc aperture is circularly shaped, and a depth of said cylindrical shield and a diameter of said circular disc aperture are governed by the equation:

$$SE_{(db)} = 31.95 \frac{t}{d} \sqrt{1 - \left(\frac{df}{6920}\right)^2}$$

where SE represents the shielding effectiveness of said cylindrical shield, t represents the depth of said cylindrical shield, d represents the diameter of said circular disc aperture, and f represents the frequency of the EMI being shielded.

10. A device according to claim 9, wherein said cylindrical shield is made of a material that is Galvanically compatible with the material of the enclosure, and said cylindrical filter is made of ferrite.

11. A device according to claim 9, wherein said electrical component is secured to said first inner space of said housing by threads contained in said first inner space and on said electrical component.

12. A device according to claim 9, wherein said inner surface of said housing is cylindrically shaped and said outer surface of said housing is octagonally shaped.

13. A device for use with an enclosure having an aperture therein, said shielding device comprising:

a cylindrical shield having a hollow inner space;

a cylindrical filter having a hollow inner space;

a disc having an aperture, said disc being fit into said hollow inner space to define a first inner space and a second inner space wherein, said second inner space is adapted to receive said cylindrical filter wherein said disc aperture is rectangularly shaped, and a depth of said cylindrical shield and a length of said rectangular disc aperture are governed by the equation:

$$SE_{(db)} = 27.3 \frac{t}{d} \sqrt{1 - \left(\frac{df}{5910}\right)^2}$$

where SE represents the shielding effectiveness of said cylindrical shield, t represents the depth of said cylindrical shield, d represents a longest side of said rectangular disc aperture, and f represents the frequency of the EMI being shielded.

14. A device according to claim 13, wherein said cylindrical shield is made of a material that is Galvanically compatible with the material of the enclosure, and said cylindrical filter is made of ferrite.

15. A device according to claim 13, wherein said electrical component is secured to said first inner space of said housing by threads contained in said first inner space and on said electrical component.

16. A device according to claim 13, wherein said inner surface of said housing is cylindrically shaped and said outer surface of said housing is octagonally shaped.

17. A device for improving the electromagnetic interference (EMI) shielding effectiveness of an enclosure having an aperture therein, said device comprising:

an enclosure having an aperture;

a housing which has an inner surface and an outer surface;

a disc with an aperture, said disc being attached to said inner surface of said housing to define a first inner space and a second inner space, said housing being attached to said enclosure such that said first inner space is in alignment with said aperture in said enclosure; and a ferrite core with an aperture for housing a conductor, said ferrite core being fit into said second inner space wherein said disc aperture is circularly shaped, and a depth of said housing and a diameter of said circular disc aperture are governed by the equation:

$$SE_{(db)} = 31.95 \frac{t}{d} \sqrt{1 - \left(\frac{df}{6920}\right)^2}$$

where SE represents the shielding effectiveness of said housing, t represents the depth of said housing, d represents the diameter of said circular disc aperture, and f represents the frequency of the EMI being shielded.

18. A device according to claim 17, wherein said housing is made of a material that is Galvanically compatible with the material of the enclosure.

19. A device for improving the electromagnetic interference (EMI) shielding effectiveness of an enclosure having an aperture therein, said device comprising:

an enclosure having an aperture;

a housing which has an inner surface and an outer surface;

a disc with an aperture, said disc being attached to said inner surface of said housing to define a first inner space and a second inner space, said housing being attached to said enclosure such that said first inner space is in alignment with said aperture in said enclosure, and a ferrite core with an aperture for housing a conductor, said ferrite core being fit into said second inner space wherein said disc aperture is rectangularly shaped, and a depth of said housing and a length of said rectangular disc aperture are governed by the equation:

$$SE_{(db)} = 27.3 \frac{t}{d} \sqrt{1 - \left(\frac{df}{5910}\right)^2}$$

where SE represents the shielding effectiveness of said housing, t represents the depth of said housing, d represents a longest side of said rectangular disc aperture, and f represents the frequency of the EMI being shielded.

20. A device according to claim 19, wherein said housing is made of a material that is Galvanically compatible with the material of the enclosure.

* * * * *